(12) United States Patent
Twitchell et al.

(10) Patent No.: US 6,335,767 B1
(45) Date of Patent: Jan. 1, 2002

(54) BROADCAST TRANSMISSION SYSTEM WITH DISTRIBUTED CORRECTION

(75) Inventors: Edwin Ray Twitchell, San Jose, CA (US); Robert J. Plonka, Quincy, IL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/312,354

(22) Filed: May 14, 1999

Related U.S. Application Data

(63) Continuation-in-part of application No. 09/105,824, filed on Jun. 26, 1998.

(51) Int. Cl.[7] .................................................. H04N 5/21
(52) U.S. Cl. ...................... 348/608; 375/297; 330/149; 348/470
(58) Field of Search .................................. 348/608, 723, 348/470, 21; 375/297, 296, 346, 350; 330/149; 714/774

(56) References Cited

U.S. PATENT DOCUMENTS 4,870,371 A * 9/1989 Gottwald et al. ............ 330/149
5,732,333 A * 3/1998 Cox et al. .................... 455/126
6,054,825 A * 4/2000 Danielsons et al. ......... 330/149

* cited by examiner

Primary Examiner—Victor R. Kostak
(74) Attorney, Agent, or Firm—Tarolli, Sundheim, Covell, Tummino & Szabo L.L.P.

(57) ABSTRACT

A transmission system (14) broadcasts an information signal. Within the system (14), several components (e.g., 20–24) cause distortion to the information signal as the signal is processed and proceeds toward a broadcast antenna. Specifically, the group of distortion causing components (20–24) is identified as a first group, and is arranged in a sequence along a signal path (12) toward the antenna. The first group of components (20–24) performs various functions, including amplification, but each subjects the information signal to distortion shifts away from intended values. A second group of components (e.g., 28–32) modifies the information signal to compensate for the distortion shifts imposed by the first group of components (20–24). The second group of components (28–32) is located upstream of the first group of components (20–24). The second group of components (28–32) is arranged in a sequence to modify the information signal to compensate for the distortions in an order inverse to the occurrence of the distortions. Specifically, compensation for linear and non-linear distortions occurs in an order that is inverse to the occurrence of the linear and non-linear distortions.

20 Claims, 4 Drawing Sheets

BROADCAST TRANSMISSION SYSTEM WITH DISTRIBUTED CORRECTION

RELATED APPLICATION

This application claims benefit of U.S. patent application Ser. No. 09/105,824, filed Jun. 26, 1998, and is a continuation-in-part thereof.

TECHNICAL FIELD

The present invention relates to broadcast transmission systems and is particularly directed to compensation of distortion within a digital transmission system, such as a digital TV ("DTV") transmission system.

BACKGROUND OF THE INVENTION

A high-speed broadcast transmission system such as a DTV broadcast system includes components that distort an information signal away from intended values. Specifically, the system includes a power amplifier that imposes non-linear distortion upon the signal, as the signal is amplified. Also, the broadcast transmission system includes filters, such as band-limiting filters, that impose linear distortion upon the information signal as the signal is filtered.

As a result of such distortions within the transmission system, instantaneous amplitude and phase variations (AM/AM, AM/PM) and frequency dependent amplitude and phase variations (frequency response and group delay) occur. It is to be appreciated that within a phase-amplitude modulated system, amplitude and phase integrity of the system must be preserved for optimum system performance.

Traditional equalization for television systems has been accomplished by analog, pre-distortion equalizers and correctors that are static (non-adaptive). Such equalizers and correctors require factory adjustments to provide a desired amount of pre-distortion (pre-equalization). Aging of the equalizers and correctors, and temperature change cause drift in the amount of pre-distortion that is imposed by the equalizers and correctors. Occasional field adjustments are required.

Digital signal processing techniques provide improved performance of the pre-distortion of the information signal. Specifically, digital signal processing can be used in an adaptive correction and equalization approach. Such an adaptive approach can eliminate the factory and field adjustments.

It is known to perform adaptive correction of a signal within a signal stream proceeding toward an antenna. However, in a relatively fast data system, the correction requires a relatively large amount of processing in a short period of time. In one known technique, all of the distortion (i.e., linear and non-linear) is corrected in a single step.

In another technique, the correction for the distortion imposed within the system is done component by component proceeding in a direction toward the antenna. Specifically, for each component, the signal that is output from that component is monitored to determine the amount of distortion imposed by that component. A correction is then developed for that component. Subsequently, the next subsequent component is monitored to develop the correction for that component. However, such a technique is time consuming and is often unsuitable for high data rate streams. Further, within such a system, amplitude or group delay variations over frequency can be misinterpreted to be instantaneous amplitude and phase variations.

Thus, there is a need for a high-speed technique for adaptive correction of linear and non-linear distortion within a digital broadcast transmission system.

SUMMARY OF THE INVENTION

In accordance with one aspect, the present invention provides a transmission system for broadcasting an information signal. The system includes a first plurality of components arranged in a sequence and including at least one amplifier. Each of the first plurality of components performs a function on the information signal, and each of the first plurality of components subjects the information signal to distortion shifts away from intended values. The system includes a second plurality of components for modifying the information signal to compensate for the distortion shifts imposed by the first plurality of components. The second plurality of components is located upstream of the first plurality of components. The second plurality of components is arranged in a sequence to modify the information signal to compensate for the distortions in an order inverse to the occurrence of the distortions.

In accordance with another aspect, the present invention provides a transmission system that includes a first plurality of components in a sequential arrangement. Each of the first plurality of components performs a function on the information signal. A first component of the first plurality of components subjects the information signal to linear distortion shifts away from intended values. A second component of the first plurality of components subjects the information signal to non-linear distortion shifts away from intended values. The system includes a second plurality of components that is located upstream of the first plurality of components. The second plurality of components modifies the information signal to compensate for the distortion shifts imposed by the first plurality of components. A first component of the first plurality of components modifies the information signal to compensate for the linear distortion. A second component of the second plurality of components modifies the information signal to compensate for the non-linear distortion. The first and second components of the second plurality of components are arranged in a sequence to modify the information signal to compensate for the distortions in an order inverse to the occurrence of the distortions.

In accordance with yet another aspect, the present invention provides a transmission system for broadcasting an information signal and having a signal path along which the information signal proceeds toward an antenna. Within the system, a first component is located on the signal path and performs a function on the information signal. The first component subjects the information signal to non-linear distortion shifts away from intended values. A second component is located on the signal path and performs a function on the information signal. The second component subjects the information signal to linear distortion shifts away from intended values. A third component is located on the signal path and performs a function on the information signal. The third component subjects the information signal to linear distortion shifts away from intended values. The second and third components are grouped together either upstream or downstream of the first component along the signal path. A fourth component is located on the signal path and modifies the information signal to compensate for the non-linear distortion imposed by the first component. A fifth component is located on the signal path and modifies the information signal to compensate for the linear distortion imposed by the second component. A sixth component is located on the signal path and modifies the information signal to compensate for the linear distortion imposed by the third component. The fifth and sixth components are grouped together either upstream or downstream of the fourth component along the signal path. The upstream/downstream location of the fifth and sixth components with respect to the fourth component is opposite to the upstream/downstream location of the second and third components with respect to the first component.

In accordance with still another aspect, the present invention provides a distortion compensation arrangement for a radio frequency transmitter system. The system includes an input circuit for processing digital signals to be transmitted, a digital-to-analog converter for converting the digital signals into analog form, and an up converter for modulating a radio frequency carrier by the analog signals. The system also includes at least one radio frequency filter circuit, and at least one radio frequency amplifier circuit. The filter and amplifier circuits introduce linear and non-linear distortion into the modulated radio frequency carrier. The arrangement includes adaptive digital signal distortion compensation circuitry that is connected between the input circuit and the digital-to-analog converter for processing the digital signals to be applied to the digital-to-analog converter. The adaptive digital signal distortion compensation circuitry is responsive to output signals from the radio frequency filter and amplifier circuits for modifying the digital signals to provide linear and non-linear compensation to the digital signals. The compensation sequence applied to the digital signals is such that it is inverse to the order in which the filter and amplifier circuits are connected.

In accordance with yet a still further aspect, the present invention provides a digital television radio frequency transmitter system. An input circuit processes digital television signals to be transmitted. A digital-to-analog converter converts the digital television signals into analog form. An up converter modulates a radio frequency carrier by the television analog signals. The system includes at least one radio frequency filter circuit and at least one radio frequency amplifier circuit. The filter and amplifier circuits introduce linear and non-linear distortion into the modulated radio frequency carrier television signals. A down converter receives output radio frequency carrier television signals from the filter and amplifier circuits for down converting the output signals. An analog-to-digital converter converts the down converted analog television signals from the filter and amplifier circuits into digital form. Adaptive digital signal distortion compensation circuitry is connected between the input circuit and the digital-to-analog converter for processing the digital signals to be applied to the digital-to-analog converter. The adaptive digital signal distortion compensation circuitry is responsive to the digital signals from the analog-to-digital converter corresponding to the outputs of the filter and amplifier circuits for modifying the digital television signals to provide linear and non-linear compensation to the digital television signals. The compensation sequence applied to the digital television signals is such that it is inverse to the order in which the filter and amplifier circuits are connected.

BRIEF DESCRIPTION OF THE DRAWINGS

The foregoing and other features of the present invention will become apparent to one skilled in the art to which the present invention relates upon reading the following description of the invention with reference to the accompanying drawings, wherein.

DESCRIPTION OF PREFERRED EMBODIMENTS

Figure 1:
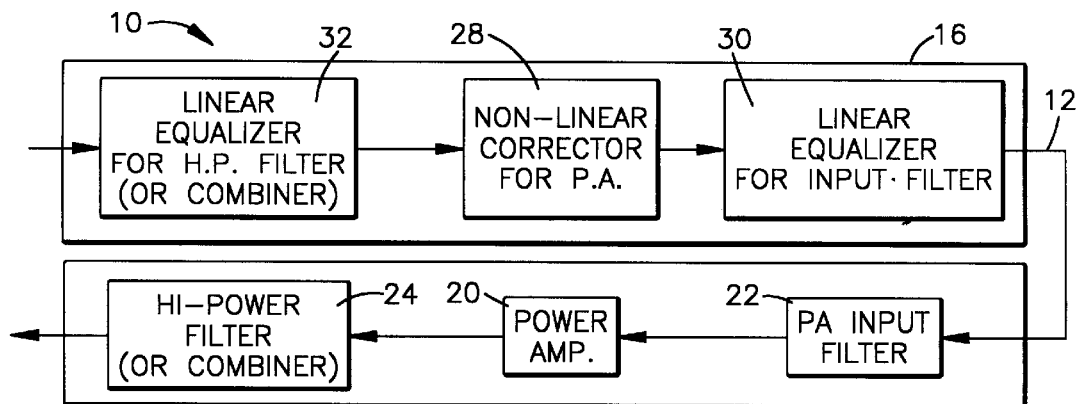
FIG. 1 is a function block diagram of components arranged in a sequence in accordance with the present invention.

One representation of the present invention is an apparatus 10 shown in function block format in FIG. 1 as a plurality of components that are located sequentially along a data stream path 12. The data stream 12 is for an information data signal that is transmitted at a relatively high rate. Further, the data signal typically has a relatively wide band (i.e., 18 MHz).

Figure 2:
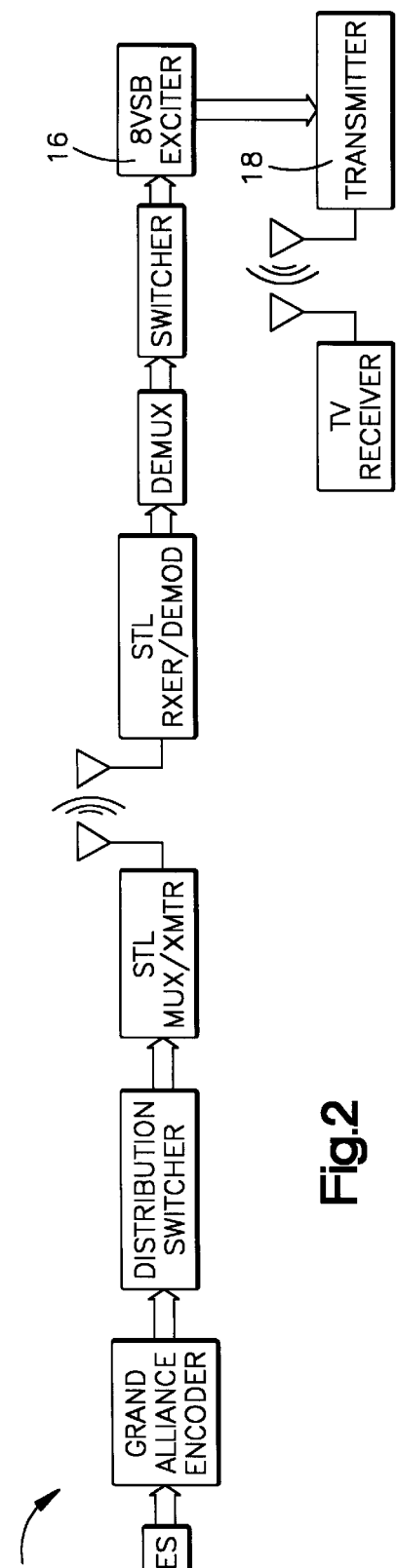
FIG. 2 is a block diagram of an example device in which the present invention is utilized.

The high data rate and bandwidth are related to the system environment in which the apparatus 10 is located. Specifically, the apparatus 10 is preferably part of a high definition ("HD") digital television ("DTV") system 14 as shown in FIG. 2. Preferably, the DTV broadcasts signals in the radio range of frequencies. In one embodiment, the broadcast signal is in the ultrahigh frequency range (300–3000 MHz), and is preferably in the range of 470–860 MHz. In pertinent part, the DTV system 14 includes an 8VSB exciter 16 and a transmitter 18.

The components of the apparatus 10 shown in FIG. 1 are located within the 8VSB exciter 16 and the transmitter 18 of FIG. 2. Specifically, the transmitter 18 (FIG. 1) includes a power amplifier 20, a pre-amplification filter 22 located upstream of the amplifier and a post-amplification filter 24 located downstream of the amplifier. Herein, the pre-amplification filter 22 is referred to as an input filter, and the post-amplification filter is referred to as a high power filter. It is to be appreciated that the transmitter 18 may include other components.

The power amplifier 20 amplifies the information signal to a power level that is suitable for broadcast transmission of a RF signal. In one example, the amplified power level is 50 kilowatts. Also, the power amplifier 20 may be comprised of an array of amplifying devices. If a plurality of amplifying devices is present within the power amplifier 20, a combiner device is located adjacent to the high power filter 24 to combine amplifier device outputs. It is to be understood that various amplifier configurations could be employed, and the high power filter would encompass suitable additional components, such as combiner circuitry.

Figure 3:
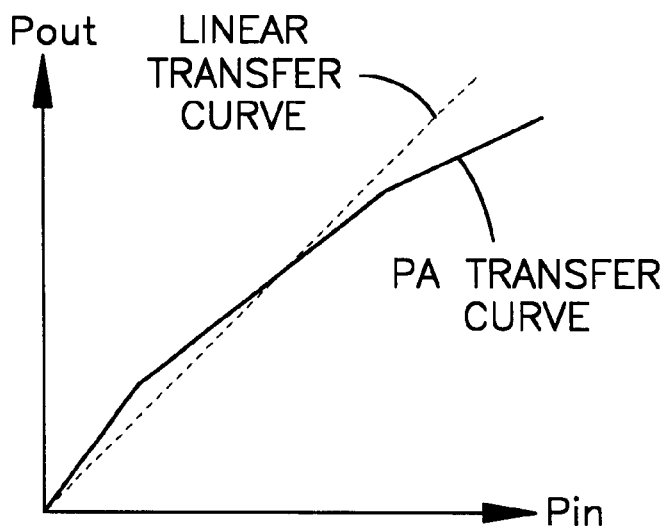
FIG. 3 is a plot of an amplifier transfer curve.

Focusing now upon a theoretical "ideal" system, all of the components of a transmitter would be ideal. Specifically, a power amplifier of the system would be ideal and the transfer curve for the ideal amplifier would be linear. A dashed line in FIG. 3 shows an example of such an ideal transfer curve. Thus, within such an ideal system, an information signal having a given pre-amplification power level would be amplified to a predetermined power level by the amplifier, based solely upon a linear relationship that dictates the amount of amplification. Also, filters of the ideal system would not impose any distortions.

Figure 4:
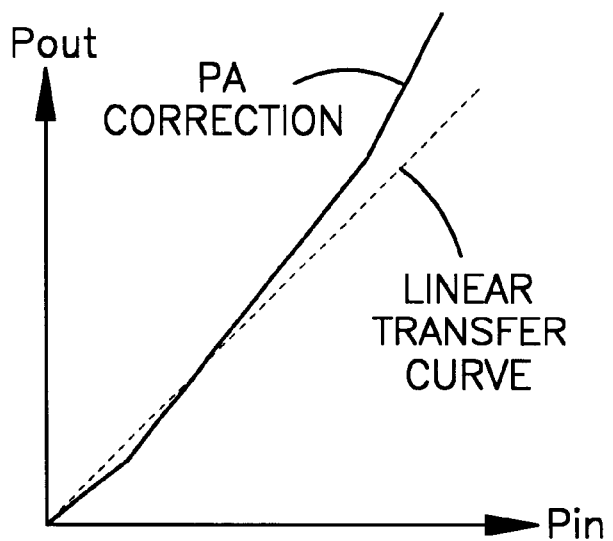
FIG. 4 is a plot of a correction provided to linearize the amplifier output.

The actual power amplifier 20 of the apparatus 10 is, however, not ideal, and the actual power transfer curve of the amplifier is not linear. A non-linear distortion is imposed by the power amplifier 20 upon the information signal during amplification of the information signal. Specifically, the non-linear distortion is directed to changes in instantaneous amplitude and phase variations. A solid line in FIG. 3 shows an example of an actual transfer curve. Accordingly, a correction must be imposed upon the information signal to compensate for the distortion caused by the power amplifier 20. The solid line in FIG. 4 shows an example of the correction.

In addition, the filters 22 and 24 of the transmitter 18 impose linear deformations to the information signal. The input filter 22 imposes a first linear distortion and the high power filter 24 imposes a second linear distortion to the information signal. Specifically, the distortion imposed by high power filter 24 is directed to group delay and amplitude response (i.e., amplitude variation versus frequency). Thus, for each of the several components 20–24 within the transmitter 18, an amount of correction or equalization must be imposed upon the information signal to compensate.

Turning again to the theoretical ideal system, any action (i.e., amplification or filtering) imposed upon the information signal would be time-invariant). Specifically, in the ideal system, the actions imposed upon the information signal would not change over time. Thus, for a given input stimulus, the ideal system always produces the same output, independent of the time at which the stimulus occurs.

However, in actuality, the transmitter 18 is time-variant. Specifically, for a given input stimulus, the output that is provided by the transmitter 18 changes over time. One reason for time-variance is thermal effects within the transmitter 18. The thermal effects cause variations in the amount of signal deformation caused by the power amplifier 20 and the filters 22 and 24 to the information signal. Thus, it is desirable to compensate for all of the deformation (i.e., linear and non-linear), and adapt to changes in the deformation.

The apparatus 10 in accordance with the present invention provides three corrector or equalizer components 28–32 within the 8VSB exciter 16 for the three distortion causing components 20–24 within the transmitter 18. Specifically, an adaptive non-linear corrector 28 (e.g., pre-equalization circuitry) imposes a pre-distortion onto the signal to compensate for the non-linear distortion caused by the power amplifier 20. An adaptive linear equalizer 30 (e.g., pre-correction circuitry) imposes a pre-distortion onto the information signal to compensate for the linear distortion caused by the input filter 22. An adaptive linear equalizer 32 (e.g., pre-equalization circuitry) imposes a pre-distortion onto the information signal to compensate for the linear distortion caused by the high power filter 24. Collectively, the linear equalizer 32, the non-linear corrector 28, and the linear equalizer 30 function as adaptive digital signal distortion compensation circuitry.

The linear equalizer 32, the non-linear corrector 28, and the linear equalizer 30 are arranged in a sequence such that the pre-distortions (or pre-corrections) are imposed in a sequential order that is the inverse of the order that distortion occurs. Specifically, because the linear distortion caused by the high power filter 24 occurs last (i.e., at a downstream location from all of the other distortions), the linear pre-distortion imposed by the linear equalizer 32 occurs first. The non-linear pre-distortion imposed by the non-linear corrector 28 occurs second because the non-linear distortion imposed by the power amplifier 20 occurs second. The linear pre-distortion imposed by the linear equalizer 30 occurs third (i.e., after the pre-distortion from the linear equalizer 32 and the pre-distortion of the non-linear corrector 28) because the distortion caused by the input filter 22 occurs first (i.e., prior to the distortion caused by the power amplifier 20 and the high power filter 24).

Inverse order pre-distortion, in accordance with the present invention, is based upon several issues. First, linear effects and non-linear effects do not retain the property of superposition (i.e., they are not interchangeable) when they are mixed together. Second linear functions, by themselves, do maintain the property of superposition when non-linear effects are not present. Third, an ideal "system" (a "system" being one or more components grouped for consideration) can be intermingled, at will, with either a linear system or a non-linear system. In other words, superposition holds with ideal systems and any other type of system. In order to demonstrate these issues, a digression into mathematics is provided. A nonlinear element, such as a power amplifier can be modeled by the following:

$$y(t)=a_1x(t)+a_2x^2(t)+a_3x^3(t)+ \ldots$$

Let x(t) be an arbitrary modulated signal given by . . .

$$x(t)=p(t)\cos(\omega+\theta)$$

where:
p(t) is the baseband modulation signal
ω is the carrier frequency
θ is a fixed phase offset.
Assuming only a $3^{rd}$ order system for simplicity, then:

$$y(t) = \frac{1}{2}a_2p^2(t) + [a_1p(t) + a_3p^3(t)]\cos(\omega t + \theta) + \frac{1}{2}a_2p^2(t)\cos[2(\omega\tau + \theta)] + \frac{1}{2}a_3p^3(t)\cos[3(\omega t + \theta)]$$

Only odd order products contribute to the fundamental amplitude. Assuming bandpass filtering is used to eliminate the DC term and harmonic terms, the general system can be reduced to a signal given as follows:

$$y(t)=[\Sigma a_k p^k(t)] \cos(\omega t+\theta) \{k=1,3,5, \ldots \}$$

For moderately non-linear to linear systems, the $a_k$ terms approach zero faster than the $p^k(t)$ terms approach infinity. This sets a limit on the order of the system. Given this model, characterization of this type of system,is rather straight-forward and requires a relatively small number of coefficient identifiers.

Figure 9:
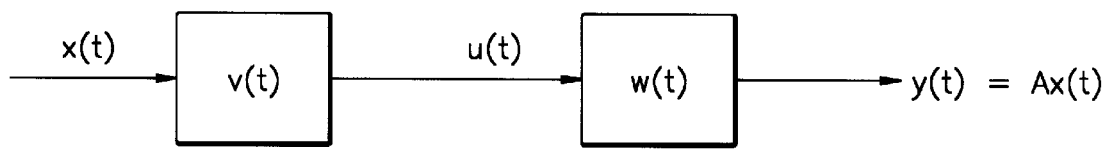
FIGS. 9–12 are illustrations of mathematical models of cascaded systems.
Figure 10:
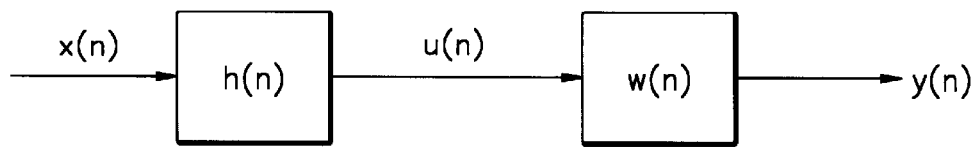

A cascaded correction system is shown in FIG. 9. Choosing w(t) to be a second order non-linear system given by:

$$w(t)=a_1x(t)+a_2x^2(t)$$

Also, if it is assumed that v(t) is an arbitrary order non-linear polynomial corrector given by:

$$v(t)=b_1x(t)+b_2x^2(t)+b_3x^3(t)+ \ldots$$

If it is desired that the output of the cascaded system is a linear function of the input, namely y(t)=Ax(t), where A is some scalar value (assumed to be unity simplicity).

The system transfer function is given by:

$$y(t) = x(t) = a_1 v(t) + a_2 v^2(t)$$

$$x(t) = a_1[b_1 x(t) + b_2 x^2(t) + b_3 x^3(t) + \ldots] + a_2[b_1 x(t) + b_2 x^2(t) + b_3 x^3(t) \ldots]^2$$

$$x(t) = a_1 b_1 x(t) + [a_1 b_2 + a_2 b_1^2] x^2(t) + \ldots$$

There is no exact solution to the equation, but an approximation can be made to a specified order. An approximate second order solution would be:

$$a_1 = 1/b_1$$

$$a_2 = -b_2/b_1^3$$

Although this approximate solution cancels the second order term, it generates higher order product terms. In general, this correction technique compensates for non-linear artifiacts less than or equal to the order of pre-correction. Higher order artificates are generated, the highest of which is the sum of both the pre-correction and the non-linear system combined. This approximation is useful to the extent that the higher order products are small.

Turning now to a linear system, any linear system can be modeled by a general auto-regressive moving average process:

$$G(z) = (\Sigma b z^{-k})/(1 - \Sigma a_k z^{-k})$$

Correction for these systems requires the inverse function, namely:

$$H(z) = 1/G(z)$$

For any polynomial of the form given by G(z), there exists an inverse H(z). However, there is no guarantee that the inverse will be stable. A common practice is to implement an all-pole approximation of the inverse system assuring stability. The order of the inverse system becomes a matter of performance and processing resources.

The correction of cascaded linear and non-linear systems provides a more difficult challenge. The most difficult problem is controlling the order of the system corrector. The order becomes multiplicative rather than additive for these types of systems. For example, the classic Volterra series expansion for both non-linear and frequency dependent systems is given in general discrete form as:

$$y(n) = \Sigma\Sigma \ldots \Sigma h_k(\tau_1 \ldots \tau_k) x(n-\tau_1) \ldots x(n-\tau_k)$$

Summations in order are:

$$k = 1 \ldots \text{infinite};$$

$$\tau_1 = 0 \ldots N_1 \ldots$$

$$\tau_k = 0 \ldots N_k$$

These types of systems require much higher order modeling which is expensive and complex in high speed systems such as HDTV.

Figure 12:
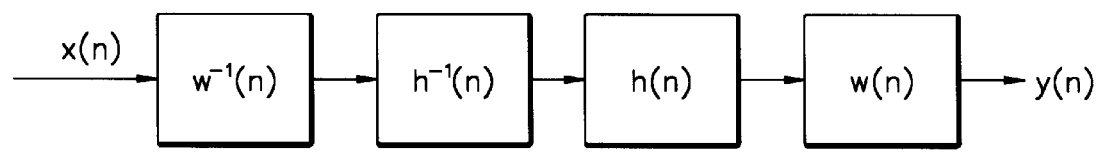

An example of a cascaded linear and non-linear system is given in FIG. 12, where h(n) is a linear system of order m+1. Its transfer function can be written as:

$$u(n) = x(n)h_0 + x(n-1)h_1 + x(n-2)h_2 + \ldots x(n-m)h_m$$

The system w(n) is assumed to be a nonlinear system of order k+1. Its transfer function is written as:

$$w(n) = a_1 u(n) + a_2 u^2(n) + a_3 u^3(n) + \ldots + a_k u^k(n)$$

Then in general, the transfer function of the cascaded system is:

$$y(n) = a_{0,0}x(n) + a_{0,1}x(n-1) + a_{0,2}x(n-1) + \ldots + a_{0,m}x(n-m) +$$

$$a_{1,0}x(n) + a_{1,1}x(n-1) + a_{1,2}x(n-1) + \ldots + a_{1,m}x(n-m)$$

$$\ldots +$$

$$a_{k,0}x(n) + a_{k,1}x(n-1) + a_{k,2}x(n-1) + \ldots + a_{k,m}x(n-m)$$

The order of the system is (k+1)(m+1) rather than k+m+2. Cost and complexity become prohibitive for high speed systems of significant order. The problem that the above mixed system imposes can be avoided to a large degree by distributing the system correction.

Figure 11:
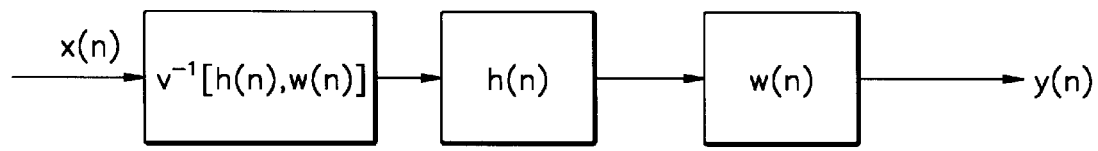

Consider the two systems shown in FIGS. 11 and 12. The system in FIG. 11 uses a single block to pre-correct for both the linear and non-linear system functions. The pre-correction $V^{-1}[h(n),w(n)]$ represents the inverse of the equation given above for the cascaded linear and non-linear system. The order required for this correction would be (k+1)(m+1) as indicated above. The system of FIG. 12 distributes the correction between a linear and non-linear block $w^{-1}(n)$ and $h^{-1}(n)$, respectively.

The $h^{-1}(n)$ corrector need only provide linear correction for h(n). Although equalizers vary, for discussion purposes, it is assumed that the order used is equal to the order of h(n). In this example the order is given as m. Given that $h^{-1}(n)$ has corrected for h(n) perfectly, the residual system behavior is entirely non-linear. This allows for a much lower order corrector. It must be noted that the order of equalizer needed depends on many things including type of filter, performance needed, stability, etc. Also, the order of the non-linear corrector required is a function of the higher order effects (speed which $a_1$ goes to zero). A typical rule of thumb is twice the order of the non-linear system. For high order systems, the benefit of this approach is easily seen.

Figure 5:
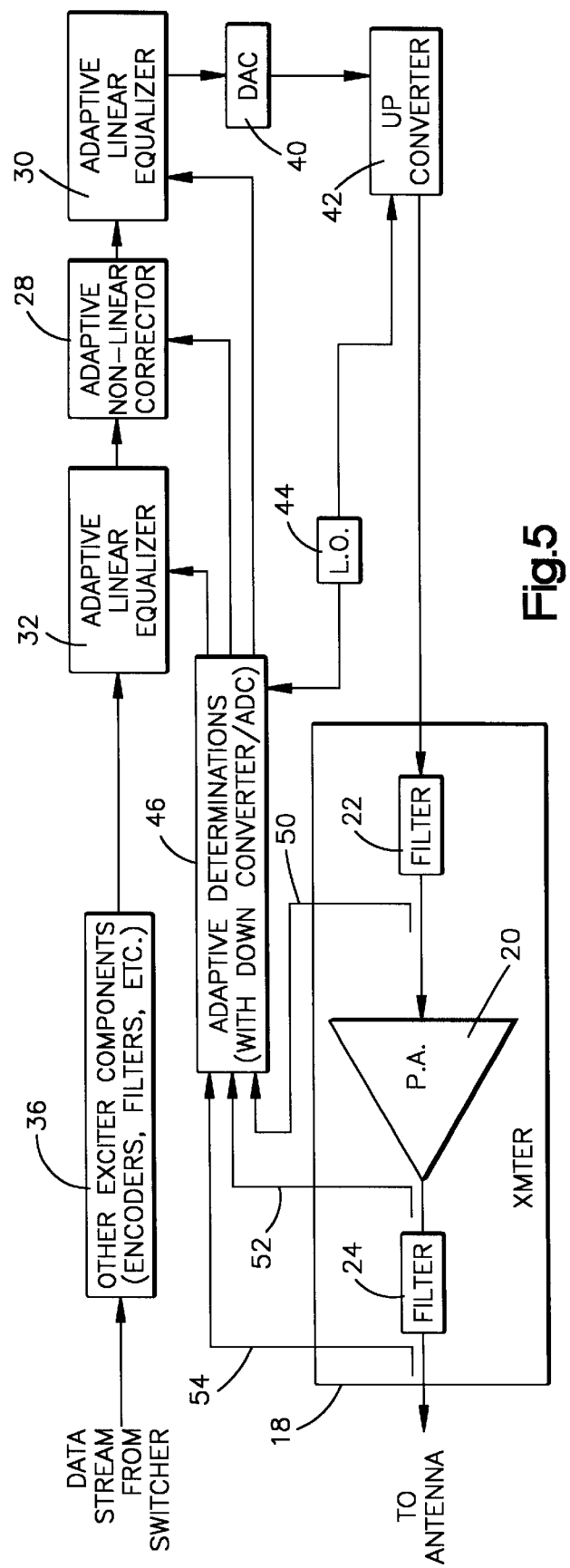
FIG. 5 is a block diagram of a portion of the device shown in FIG. 2, which details an arrangement in accordance with the present invention.

A more detailed example of the apparatus 10 in accordance with the present invention functioning within the system 14 is shown in FIG. 5. Specifically, other exciter components 36 within the 8VSB exciter 16 are shown providing the signal to the linear equalizer 32. In one embodiment, the information data stream input into the linear equalizer 30 is comprised of 32 byte words defined within a phase amplitude modulated electrical signal.

The linear equalizer 32 is preferably a FIR digital filter that has suitable structure for pre-compensating or pre-equalizing the information signal to compensate for the linear distortion caused by the high power filter 24. The linear equalizer 32 may be comprised of, or include, a microprocessor that performs a program process and/or may be comprised of, or include, discrete "hard-wired" circuitry. It is to be appreciated that other filter types can be employed (e.g., IIR, a combination of FIR and IIR, or even an analog filter).

The information signal passes from the linear equalizer 32 to the non-linear corrector 28. The non-linear corrector 28 may have any suitable structure for pre-distorting (i.e., pre-compensating or pre-equalizing) the signal to compensate for the non-linearities caused by the power amplifier 20. Specifically, the non-linear corrector 28 may impose a linear piecewise correction curve that employs an iterative or empirical approach to routinely update a set of correction values within a memory. Thus, the non-linear corrector may be comprised of, or include, a microprocessor that performs a program process and/or may be comprised of, or include, discrete "hard-wired" circuitry.

The output of the non-linear corrector 28 is provided to the linear equalizer 30. The linear equalizer 30 may have any suitable components for pre-distorting the signal to compensate for the linear distortion caused by the input filter 22. In one embodiment, the structure and function of the linear equalizer 30 is similar to the structure and function of the linear equalizer 32, except that different pre-distortions are imposed. The output of the linear equalizer 30 is provided to a digital-to-analog converter (DAC) 40.

The information signal proceeds through the DAC 40 and through an up converter 42, which is driven by a local oscillator 44 to provide the information signal as a modulated radio frequency signal. The modulation is via the output of the DAC 40. The information signal then proceeds through the input filter 22, the power amplifier 20, and the high power filter 24.

The system 14 includes an adaptive determinations function 46 which facilitates the selection of various sample points of the signal so that the equalizer 32, the corrector 28, and the equalizer 30 can provide pre-correction. Any suitable adaptation may be utilized for each of the three pre-distortion components 28–32. In order for the adaptation to operate, a first sample signal 50 is coupled off within the transmitter 18 subsequent to filtering by the input filter 22. A second sample signal 52 is coupled off within the transmitter 18 subsequent to amplification by the power amplifier 20. A third sample signal 54 is coupled off within the transmitter 18 subsequent to filtering by the high power filter 24.

Figure 7:
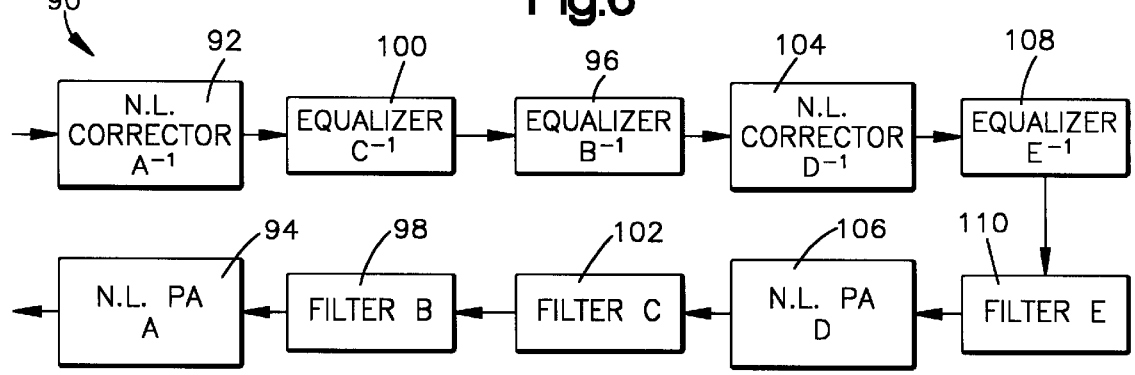
FIG. 7 is a function block diagram of yet another embodiment in accordance with the present invention.

FIG. 1 shows the simplified block diagram of the system of FIG. 7. It can be seen that the system is a cascade linear and non-linear system that can take advantage of a distributed correction scheme.

Figure 6:
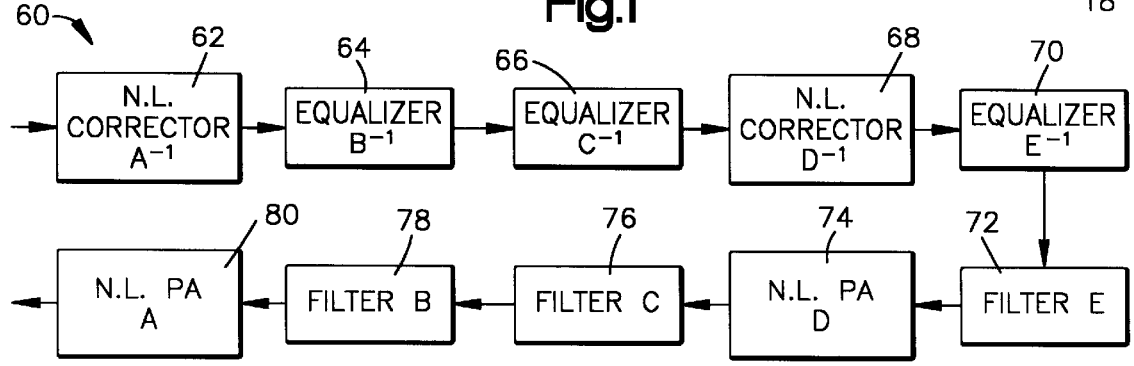
FIG. 6 is a function block diagram of another embodiment in accordance with the present invention.

The function block diagram of FIG. 6 shows another example of an apparatus 60 in accordance with the present invention. Specifically, the apparatus 60 includes a non-linear corrector $A^{-1}$ 62, a linear equalizer $B^{-1}$ 64, a linear equalizer $C^{-1}$ 66, a non-linear corrector $D^{-1}$ 68, and a linear equalizer $E^{-1}$ 70. These components 62–70 pre-distort a supplied information signal to compensate for distortion caused by the downstream components of a filter E 72, a non-linear power amplifier D 74, a filter C 76, a filter B 78, and a non-linear power amplifier A 80. A compensating component (e.g., linear equalizer $C^{-1}$ 66) exists for each distorting component (e.g., filter C 76). Each compensating component has an inverse effect with regard to distortion of the information signal. Hence, the alphabetic identifiers are paired to indicated a distorting action (e.g., A) and the inverse action of compensating (e.g., $A^{-1}$).

The location of each compensating component is at the "inverse" of the location of the associated distorting component. Thus, the order of pre-distortion is in a reverse order of the distortions caused by the filter E 72, the non-linear power amplifier D 74, the filter C 76, the filter B 78, and the non-linear power amplifier A 80. For example, the first compensating component (i.e., the non-linear corrector $A^{-1}$ 62) is associated with the last distorting component (i.e., the non-linear power amplifier A 80).

The function block diagram of FIG. 7 shows another example of an apparatus 90 in accordance with the present invention. The apparatus 90 is a variation of the apparatus 60 of FIG. 6. The apparatus 90 (FIG. 7) illustrates that a sequence of pre-distorting components can be rearranged such that the sequence is not an exact inverse of the sequence by which distortion occurs, so long as transposition of linear pre-distortion does not extend beyond the location of any non-linear pre-distortion.

Specifically, in the example shown in FIG. 7, a non-linear corrector $A^{-1}$ 92 compensates for the non-linear distortion that is caused by the non-linear power amplifier A 94. A linear equalizer $B^{-1}$ 96 compensates for the linear distortion caused by a filter B 98. A linear equalizer $C^{-1}$ 100 compensates for the linear distortion caused by the filter C 102. A non-linear corrector $D^{-1}$ 104 compensates for the non-linear distortion caused by the non-linear power amplifier D 106. A linear equalizer $E^{-1}$ 108 compensates for the linear distortion caused by the filter E 110.

The order of distortion is E, D, C, B, and A, but the order of pre-distortion compensation is $A^{-1}$, $C^{-1}$, $B^{-1}$, $D^{-1}$, and $E^{-1}$. The linear equalizer $C^{-1}$ 100 is located upstream (i.e., prior) to the linear equalizer $B^{-1}$ 96. The arrangement $A^{-1}$, $C^{-1}$, $B^{-1}$, $D^{-1}$, and $E^{-1}$ properly compensates for the distortion. The order of a group of components that compensates for a sequence segment of linear distortion is rearrangable so long as the rearrangement does not move a component for linear compensation past a component for non-linear compensation. In the illustrated example, the linear equalizer $E^{-1}$ 108 could not be rearranged with either the linear equalizer $B^{-1}$ 96 or the linear equalizer $C^{-1}$ 100 because the rearrangement would cross the non-linear corrector $D^{-1}$ 104.

Figure 8:
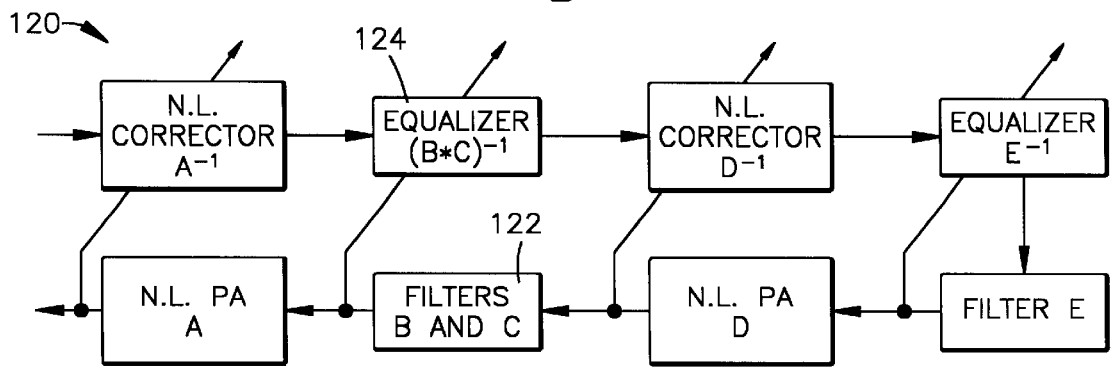
FIG. 8 is a function block diagram of still another embodiment in accordance with the present invention.

The block diagram of FIG. 8 illustrates an apparatus 120 in accordance with the present invention. The apparatus 120 is a variation of the apparatus 60 of FIG. 6 and illustrates that groups of like-kind distortion can be handled as an aggregate. Within FIG. 8, filters B and C are combined into a single filter block 122. The filters B and C still impose linear distortion onto the information signal. However, the linear pre-distortion that compensates for the linear distortion of the filters B and C is combined into a single step within a linear equalizer $(B^*C)^{-1}$ 124.

Such combining is useful especially for the apparatus 120, which is adaptive. The apparatus 120 uses feedback to calculate/generate compensation values, which are used within the correctors and equalizers. Thus, as shown by FIG. 8, four feedback loops are required, as opposed to five. The reduced number of feedbacks requires a lesser amount of hardware and calculation/computation, and memory compared to the situation in which separate correction occurs for filter B and filter C.

From the above description of the invention, those skilled in the art will perceive improvements, changes and modifications. For example, it is known to define a transmitter as including additional components, such as the exciter. Such improvements, changes and modifications within the skill of the art are intended to be covered by the appended claims.

Having described the invention, the following is claimed:

1. A transmission system for broadcasting an information signal, said system comprising:

a first plurality of components arranged in a sequence and including at least one amplifier, each of said first plurality of components for performing a function on the information signal and each subjecting the information signal to distortion shifts away from intended values; and a second plurality of components for modifying the information signal to compensate for the distortion shifts imposed by said first plurality of components, said second plurality of components being located upstream of the first plurality of components, and said second plurality of components being arranged in a sequence to modify the information signal to compensate for the distortions in an order inverse to the occurrence of the distortions.

2. A system as set forth in claim 1, wherein said first plurality of components includes a first component that causes linear distortion and a second component that causes non-linear distortion.

3. A system as set forth in claim 1, wherein the number of components in said first plurality of components is equal to the number of components in said second plurality of components.

4. A transmission system for broadcasting an information signal, said system comprising:
   a first plurality of components in a sequential arrangement, each for performing a function on the information signal, a first component of said first plurality of components subjecting the information signal to linear distortion shifts away from intended values, and a second component of said first plurality of components subjecting the information signal to non-linear distortion shifts away from intended values; and
   a second plurality of components, located upstream of the first plurality of components, for modifying the information signal to compensate for the distortion shifts imposed by said first plurality of components, a first component of said second plurality of components modifying the information signal to compensate for the linear distortion and a second component of said second plurality of components modifying the information signal to compensate for the non-linear distortion, said first and second components of said second plurality of components being arranged in a sequence to modify the information signal to compensate for the distortions in an order inverse to the occurrence of the distortions.

5. A system as set forth in claim 4, wherein said first component of said first plurality of components is located upstream of said second component of said first plurality of components, and said second component of said second plurality of components is located upstream of said first component of said second plurality of components.

6. A system as set forth in claim 5, wherein a third component of said first plurality of components subjects the information signal to linear distortion shifts away from intended values, a third component of said second plurality of components modifies the information signal to compensate for the linear distortion caused be said third component of said first plurality of components, said third component of said first plurality of components is located downstream of said second component of said first plurality of components, and said second component of said second plurality of components is located downstream of said third component of said second plurality of components.

7. A system as set forth in claim 4, wherein said second component of said first plurality of components is located upstream of said first component of said first plurality of components, and said first component of said second plurality of components is located upstream of said second component of said second plurality of components.

8. A system as set forth in claim 4, wherein the number of components in said first plurality of components is equal to the number of components in said second plurality of components.

9. A transmission system for broadcasting an information signal and having a signal path along which the information signal proceeds toward an antenna, said system comprising:
   a first component, located on the signal path, for performing a function on the information signal, said first component subjecting the information signal to non-linear distortion shifts away from intended values;
   a second component, located on the signal path, for performing a function on the information signal, said second component subjecting the information signal to linear distortion shifts away from intended values;
   a third component, located on the signal path, for performing a function on the information signal, said third component subjecting the information signal to linear distortion shifts away from intended values, said second and third components being grouped together either upstream or downstream of said first component along the signal path;
   a fourth component, located along the signal path, for modifying the information signal to compensate for the linear distortion imposed by said first component;
   a fifth component, located along the signal path, for modifying the information signal to compensate for the linear distortion imposed by said second component; and
   a sixth component, located along the signal path, for modifying the information signal to compensate for the linear distortion imposed by said third component, said fifth and sixth components being grouped together either upstream or downstream of said fourth component along the signal path, the upstream/downstream location of said fifth and sixth components with respect to said fourth component being opposite to the upstream/downstream location of said second and third components with respect to said first component.

10. A system as set forth in claim 9, wherein said second component is upstream of said third component, and said fifth component is downstream of said sixth component.

11. A system as set forth in claim 9, wherein said second component is downstream of said third component, and said fifth component is upstream of said sixth component.

12. A system as set forth in claim 9, wherein said fifth and sixth components are combined to simultaneously compensate for the linear distortion imposed by said second and third components.

13. A distortion compensation arrangement for a radio frequency transmitter system including an input circuit for processing digital signals to be transmitted, a digital-to-analog converter for converting the digital signals into analog form, an up converter for modulating a radio frequency carrier by the analog signals, at least one radio frequency filter circuit, and at least one radio frequency amplifier circuit, and wherein the filter and amplifier circuits introduce linear and non-linear distortion into the modulated radio frequency carrier, the distortion compensation arrangement comprising:
   adaptive digital signal distortion compensation circuitry connected between the input circuit and the digital-to-analog converter for processing the digital signals to be applied to the digital-to-analog converter, said adaptive digital signal distortion compensation circuitry being responsive to output signals from the radio frequency filter and amplifier circuits for modifying the digital signals to provide linear and non-linear compensation to the digital signals, the compensation sequence applied to the digital signals is such that it is inverse to the order in which the filter and amplifier circuits are connected.

14. A distortion compensation arrangement as set forth in claim 13, wherein:
   the radio frequency amplifier circuit is coupled to an output circuit;
   output signals are applied from the output circuit to said adaptive digital signal distortion compensation circuitry for modifying the digital signals for distortions introduced by the output circuit, and the modification of digital signals for distortions introduced by the output circuit is the first in the compensation sequence performed by said adaptive digital signal distortion compensation circuitry.

15. A distortion compensation arrangement as set forth in claim 14, wherein:

said adaptive digital signal distortion compensation circuitry includes a plurality of compensation circuits connected in series for sequentially modifying the digital signals, said compensation circuits including linear and non-linear compensating circuits connected in an order inverse to the order of the linear and non-linear distortion introduced by the filter, amplifier and output circuits.

16. A distortion compensation arrangement as set forth in claim 13, wherein:

the radio frequency transmitter includes a series sequentially connected combination of a first filter, a first amplifier, a second filter, a second amplifier, and wherein the filter circuits introduce linear distortion and the amplifiers introduce non-linear distortion, and said adaptive digital signal distortion compensation circuitry includes a series sequentially connected combination of a first non-linear compensating circuit responsive to the output of the second amplifier, a first linear compensating circuit responsive to the output of the second filter, a second non-linear compensating circuit responsive to the output of the first amplifier, and a second linear compensating circuit responsive to the output of the first filter.

17. A digital television radio frequency transmitter system comprising:

an input circuit for processing digital television signals to be transmitted;

a digital-to-analog converter for converting the digital television signals into analog form;

an up converter for modulating a radio frequency carrier by the television analog signals;

at least one radio frequency filter circuit;

at least one radio frequency amplifier circuit, wherein said filter and amplifier circuits introduce linear and non-linear distortion into the modulated radio frequency carrier television signals;

a down converter for receiving output radio frequency carrier television signals from said filter and amplifier circuits for down converting the output signals;

an analog-to-digital converter for converting the down converted analog television signals from said filter and amplifier circuits into digital form, and adaptive digital signal distortion compensation circuitry connected between said input circuit and said digital-to-analog converter for processing the digital signals to be applied to said digital-to-analog converter, the said adaptive digital signal distortion compensation circuitry being responsive to the digital signals from said analog-to-digital converter corresponding to the outputs of said filter and amplifier circuits for modifying the digital television signals to provide linear and non-linear compensation to the digital television signals, the compensation sequence applied to the digital television signals is such that it is inverse to the order in which said filter and amplifier circuits are connected.

18. A digital television radio frequency transmitter as set forth in claim 17, wherein:

said adaptive digital signal distortion compensation circuitry includes a plurality of compensation circuits connected in series for sequentially modifying the digital television signals, said compensation circuits including linear and non-linear compensating circuits connected in an order inverse to the order of the linear and non-linear distortion introduced by said filter and amplifier circuits.

19. A digital television radio frequency transmitter as set forth in claim 18, wherein:

said amplifier circuit is coupled to an output circuit;

output signals are applied from said output circuit to said adaptive digital signal distortion compensation circuitry for modifying the digital television signals for distortions introduced by said output circuit, and the modification of digital television signals for distortions introduced by the output circuit is the first in the compensation sequence performed by said adaptive signal distribution compensation circuitry.

20. A digital television radio frequency transmitter as set forth in claim 18, wherein:

said at least one filter circuit includes first and second filter circuits, and at least one amplifier circuit includes first and second amplifier circuits, said filter and amplifier circuits being a series sequentially connected combination of said first filter circuit, said first amplifier circuit, said second filter circuit, and said second amplifier circuit, and wherein said filter circuits introduce linear distortion and said amplifier circuits introduce non-linear distortion, and said adaptive digital signal distortion compensation circuitry includes a series sequentially connected combination of a first non-linear compensating circuit responsive to the output of said second amplifier circuit, a first linear compensating circuit responsive to the output of said second filter circuit, a second non-linear compensating circuit responsive to the output of said first amplifier circuit, and a second linear compensating circuit responsive to the output of said first filter circuit.

* * * * *